(12) United States Patent
Kato et al.

(10) Patent No.: US 10,889,101 B2
(45) Date of Patent: Jan. 12, 2021

(54) SCREEN PRINTER INCLUDING CLAMP DEVICE TO GRIP BOARD

(71) Applicant: FUJI CORPORATION, Chiryu (JP)

(72) Inventors: Mitsuaki Kato, Anjo (JP); Yoshimune Yokoi, Kiyosu (JP)

(73) Assignee: FUJI CORPORATION, Chiryu (JP)

(*) Notice: Subject to any disclaimer, the term of this patent is extended or adjusted under 35 U.S.C. 154(b) by 29 days.

(21) Appl. No.: 16/336,961

(22) PCT Filed: Oct. 13, 2016

(86) PCT No.: PCT/JP2016/080379
§ 371 (c)(1),
(2) Date: Mar. 27, 2019

(87) PCT Pub. No.: WO2018/070016
PCT Pub. Date: Apr. 19, 2018

(65) Prior Publication Data
US 2019/0224960 A1    Jul. 25, 2019

(51) Int. Cl.
*B41F 15/18* (2006.01)
*B41F 15/26* (2006.01)
(Continued)

(52) U.S. Cl.
CPC .......... *B41F 15/08* (2013.01); *B41F 15/0881* (2013.01); *B41F 15/20* (2013.01);
(Continued)

(58) Field of Classification Search
CPC .. B41F 15/08; B41F 15/0881; B41F 15/0845; B41F 15/085; B41F 15/16; B41F 15/18;
(Continued)

(56) References Cited

U.S. PATENT DOCUMENTS
2011/0297020 A1    12/2011    Tanaka

FOREIGN PATENT DOCUMENTS
JP          07040524 A   *  2/1995
JP          2005-158831 A   6/2005
(Continued)

OTHER PUBLICATIONS

International Search Report dated Dec. 20, 2016 in PCT/JP2016/080379 filed on Oct. 13, 2016.

*Primary Examiner* — Leslie J Evanisko
(74) *Attorney, Agent, or Firm* — Oblon, McClelland, Maier & Neustadt, L.L.P.

(57) ABSTRACT

A screen printer including a squeegee device to spread from above solder paste on a stencil; a clamp device to grip a board conveyed to a position below the stencil by a board conveyance member that is flat and provided with a board holding portion in a central opening portion, the clamp device gripping the board via the board conveyance member; a board supporting device to support the board from below and move the board in a vertical direction inside the clamp device; and a raising and lowering device to move the board supported inside the clamp device in the vertical direction and position the board at a printing position, and the clamp device is provided with a board printing guide member to be removably attached to an upper end of a pair of clamp members to sandwich the board conveyance member in a widthwise direction.

4 Claims, 7 Drawing Sheets

(51) Int. Cl.
    *B41F 15/08*       (2006.01)
    *B41F 15/46*       (2006.01)
    *B41F 15/36*       (2006.01)
    *H05K 3/12*        (2006.01)
    *B41F 15/20*       (2006.01)

(52) U.S. Cl.
    CPC ............... *B41F 15/26* (2013.01); *B41F 15/36* (2013.01); *B41F 15/46* (2013.01); *H05K 3/12* (2013.01); *H05K 3/1216* (2013.01)

(58) Field of Classification Search
    CPC .......... B41F 15/20; B41F 15/36; B41F 15/46; H05K 3/1216; H05K 3/1225; H05K 3/1233
    USPC ........................................................ 101/126
    See application file for complete search history.

(56) References Cited

FOREIGN PATENT DOCUMENTS

| | | |
|---|---|---|
| JP | 2006-289817 A | 10/2006 |
| JP | 2010-56182 A | 3/2010 |
| JP | 2011-31588 A | 2/2011 |

\* cited by examiner

SCREEN PRINTER INCLUDING CLAMP DEVICE TO GRIP BOARD

TECHNICAL FIELD

The present application relates to a screen printer that, with respect to a board held by a board conveyance member and conveyed between the printer and another work machine, does not require replacement of the board conveyance member.

BACKGROUND ART

With a screen printer, a stencil with a printing pattern (through-holes used for printing) is attached, and screen printing of solder paste is performed onto a board arranged below the stencil. With such a screen printer, items such as a board conveyance device for conveying the board, a clamp device for gripping the conveyed board, a board supporting device for supporting the board from below, a stencil holding device for positioning and holding the stencil, and a squeegee device for spreading the solder paste over the top surface of the stencil are provided.

During printing onto the board, the solder paste is pressed into the printing pattern while being rolled on the stencil by the squeegee, thereby applying (printing) solder paste onto the board positioned below. A printing process performed by the screen printer in this manner is performed as a process at a manufacturing line in which other work machines such as mounters are also arranged. The board that is the work target is conveyed in order by a conveyance device inside each work machine. Here, in a case in which the board is thin such that the board will warp when being clamped in a widthwise direction, a pallet that is a board conveyance member is used to maintain the board in a flat state. The pallet used here is a flat frame member on which the board is loaded and conveyed.

CITATION LIST

Patent Literature

Patent literature 1: JP-A-2011-031588
Patent literature 2: JP-A-2005-158831

BRIEF SUMMARY

Technical Problem

However, for a board conveyed in order through various work machines such as mounters and a screen printer that configure a manufacturing line, there are cases in which the same pallet cannot be used at all the processes in the line. For example, some pallets used for conveying boards have protrusions surrounding the board that are used for positioning, such that handling is easy and the cost is low. When using such a pallet in a mounter, because the work performed is component mounting from above using a mounting head, the positioning protrusions do not affect the mounting work. However, with a screen printer, because it is necessary to arrange a stencil on top of the board for printing, it is not possible to print solder paste onto a board that is loaded on a pallet provided with positioning protrusions. Therefore, it is necessary to use a pallet with a fixing means different to positioning protrusions during a printing process, thus, with conventional manufacturing lines, it is necessary to exchange the pallets used for conveying a board between a screen printer and a mounter.

Thus, to solve the above problem, an object of the present disclosure is to provide a screen printer for which exchange of a board conveyance member is not required.

Solution to Problem

A screen printer that is an embodiment of the present disclosure includes: a squeegee device configured to spread from above solder paste on a stencil in which is formed a printing pattern; a clamp device configured to grip a board conveyed to a position below the stencil by a board conveyance member that is flat and provided with a board holding portion in a central opening portion, the clamp device gripping the board via the board conveyance member; a board supporting device configured to support the board from below and move the board in a vertical direction inside the clamp device; and a raising and lowering device configured to move the board supported inside the clamp device in the vertical direction and position the board at a printing position, wherein the clamp device is provided with a board printing guide member configured to be removably attached to an upper end of a pair of clamp members configured to sandwich the board conveyance member in a widthwise direction, the board printing guide member being formed with an opening portion in a central position thereof and configured such that the board raised from the board conveyance member by the board supporting device and arranged inside the opening portion is aligned with a top surface of the board printing guide member. Note that, "central portion" does not require that a center point of the opening portion exactly matches a center point of the board printing guide member or the board conveyance member.

Advantageous Effects

According to the present disclosure, a board printing guide member is removably attached to an upper end of a pair of clamp members, and a board is raised from the board conveyance member to the opening portion of the board printing guide member by the raising and lowering device such that the upper surface of the board is aligned with the board printing guide member, therefore, for example, even when using a board conveyance member provided with positioning protrusions to convey a board, the board is removed from the board conveyance member and arranged with the board printing guide member at a printing position under the stencil, such that the screen printer is able to perform printing onto the board.

DESCRIPTION OF EMBODIMENTS

Figure 1:
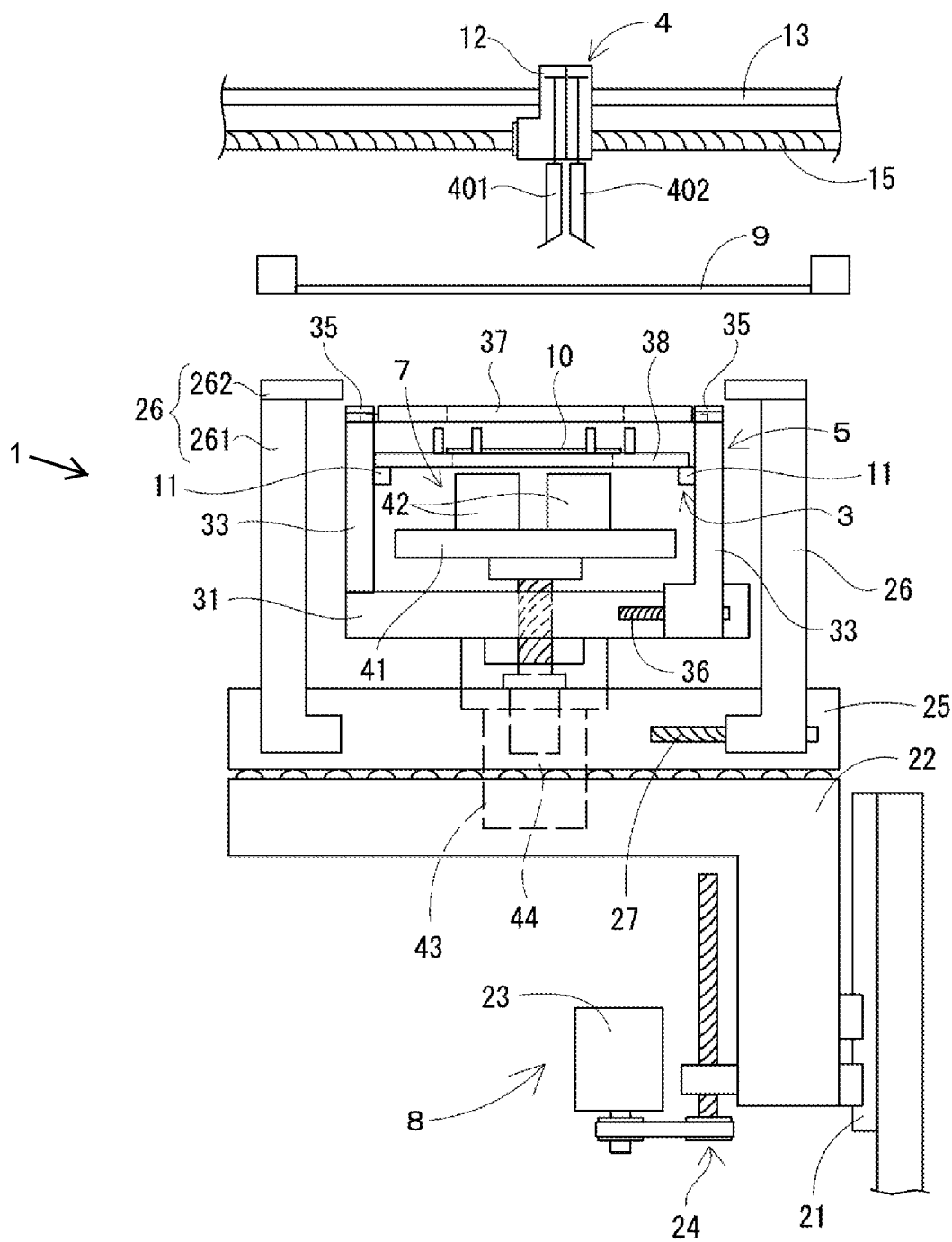
FIG. 1 schematically illustrates the internal configuration of an embodiment of a screen printer.

Hereinafter, an embodiment of the present disclosure of a screen printer will be described with reference to the figures. FIG. 1 schematically illustrates the internal configuration of an embodiment of a screen printer. Screen printer 1 is configured to perform a process prior to a component mounter machine that mounts electronic components on a board. Screen printer 1 is provided with items such as board conveyance device 3, squeegee device 4, clamp device 5 for gripping a board, board supporting device 7 for supporting a board from below, and raising and lowering device 8 for moving up and positioning a board. A control device for performing overall control of the screen printer is also loaded, with specified control being performed for drive sections of various devices.

Screen printer 1 loads and unloads board 10 using board conveyance device 3, and board conveyance device 3 is configured with pair of conveyor belts 11 that support both sides of board 10, with board 10 being conveyed in the direction perpendicular to the page in FIG. 1 (the widthwise direction of the machine body). Board conveyance device 3, clamp device 5, and board supporting device 7 are assembled on raising and lowering device 8. Thus, board 10 loaded into screen printer 1 and gripped is raised to be directly below stencil 9 by the driving of raising and lowering device 8, and is positioned at that printing position.

A line of solder paste is supplied onto stencil 9 in the widthwise direction of the machine body. Solder paste is pressed into the printing pattern while being rolled on stencil 9 by squeegee device 4, such that printing is performed onto the board 10 positioned below stencil 9. Squeegee device 4 is configured with pair of squeegee heads 401 and 402 provided with a squeegee loaded on traveling body 12 in a manner capable of being raised and lowered by a cylinder. Traveling body 12 is assembled slidably on guide rod 13 provided in a sideways direction in the figure (the front-rear direction of the machine body) and is able to move in a straight line in a horizontal direction. Also provided in screen printer 1 is screw shaft 15 parallel to guide rod 13 that is able to rotate independently, screw shaft 15 being rotated by a drive motor. A ball screw mechanism is configured from screw shaft 15 and a fixed nut inside traveling body 12.

Further, items such as clamp device 5 loaded on raising and lowering device 8 are configured below stencil 9. Raising and lowering device 8 is assembled on raising and lowering body 22 to be slidable along guide rail 21, with raising and lowering body 22 being connected to raising and lowering motor 23 via ball screw mechanism 24. Also, items such as board supporting device 7, clamp device 5, and board conveyance device 3 are loaded on traveling body 22 via support body 25. Note that, although detailed descriptions are omitted, support body 25 is configured to be adjustable with respect to raising and lowering body 22 in the X direction, Y direction, and θ direction in an XY horizontal plane.

Pair of stencil supports 26 is provided on support body 25 in a front-rear direction of the machine main body, and clamp device 5 is provided between this pair of stencil supports 26. Pair of stencil supports 26 positioned at the front and rear are each provided with gate-type leg body 261 in the widthwise direction of the machine main body, with stencil support plate 262 that contacts stencil 9 being fixed to an upper surface of gate-type leg body 261. A ball screw mechanism in which a single screw shaft 27 is engaged with a fixed nut inside leg body 261 is configured on one of the stencil supports 26. Accordingly, it is possible to adjust the distance separating the pair of stencil supports 26 by controlling the drive motor to rotate screw shaft 27.

Figure 2:
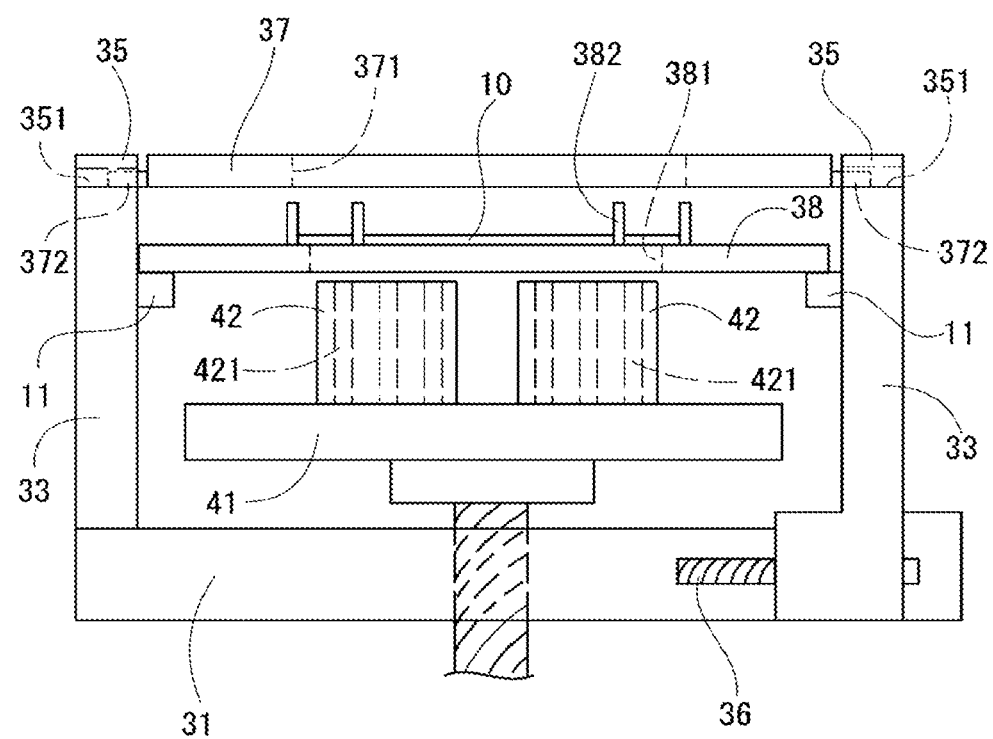
FIG. 2 is an enlarged view of a clamp device and surrounding items.
Figure 5:
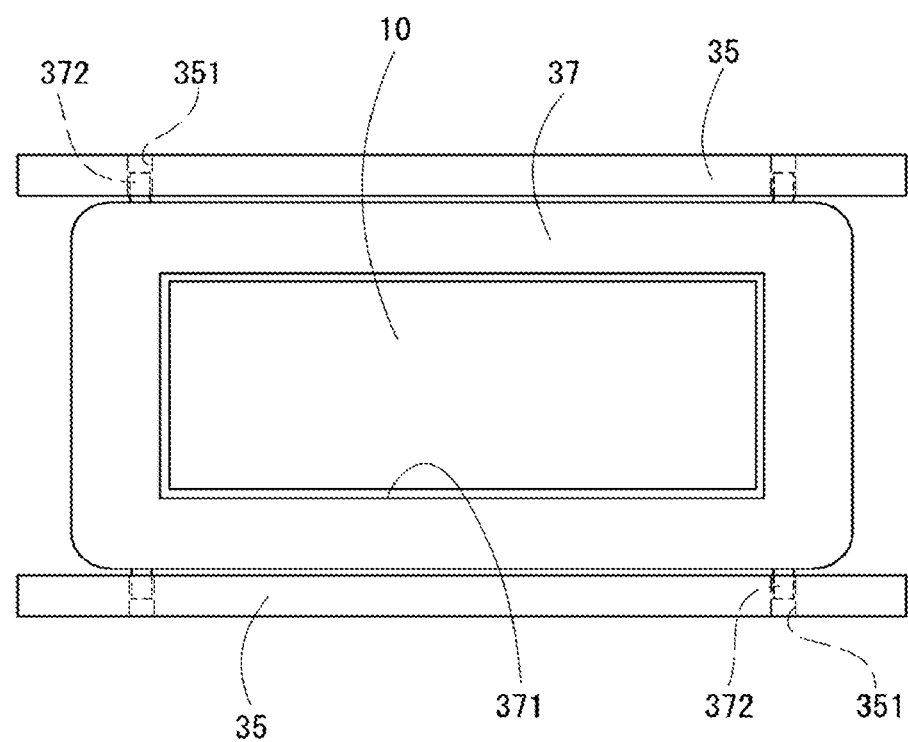
FIG. 5 is a plan view of a template attached to the clamp device.

With clamp device 5, pair of side frames 33 are provided at the front and rear of support body 31, with a ball screw mechanism configured from screw shaft 36 engaged with an internal fixed nut being provided on one of the side frames 33, and the separation distance of the pair of side frames 33 can be adjusted by the rotation of screw shaft 36 via a clamp motor. Further, clamp sections 35 are formed on an upper end of side frames 33, with board 10 being gripped from the sides by the adjustment of the separation distance of clamp sections 35. Note that, in the present embodiment, template 37 that is a board printing guide member is removably attached to clamp section 35. Here, FIG. 2 is an enlarged view of a clamp device and surrounding items; FIG. 5 is a plan view showing template 37 attached to clamp device 5.

Template 37 is a frame member configured from a plate in which rectangular opening section 371 is formed in a central portion thereof. Opening section 371 matches the shape of board 10, and is formed with a size such that a slight gap arises with board 10. Also, template 37 is formed with attachment protrusions 372 on both sides in the widthwise direction. Attachment holes 351 are formed in clamp sections 35 corresponding to attachment protrusions 372. With screen printer 1, by adjusting the separation distance between the pair of side frames 33, attachment protrusions 372 are inserted into attachment holes 351 from a horizontal direction, such that template 37 is attached in a state straddling the pair of clamp sections 35.

Figure 4:
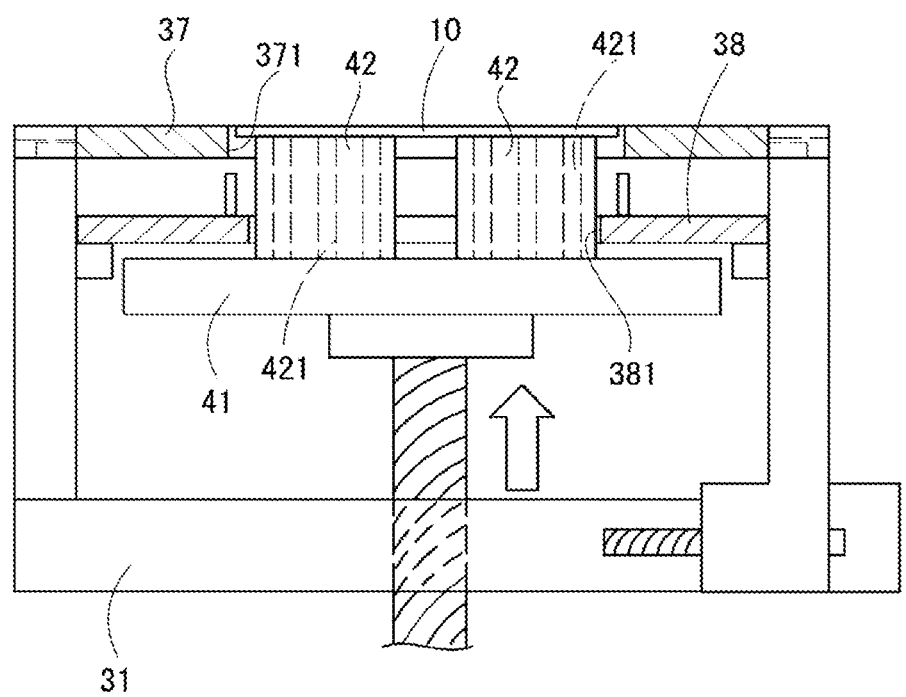
FIG. 4 is an enlarged view of a clamp device and surrounding items and shows a state with a board moved to the printing position.
Figure 6:
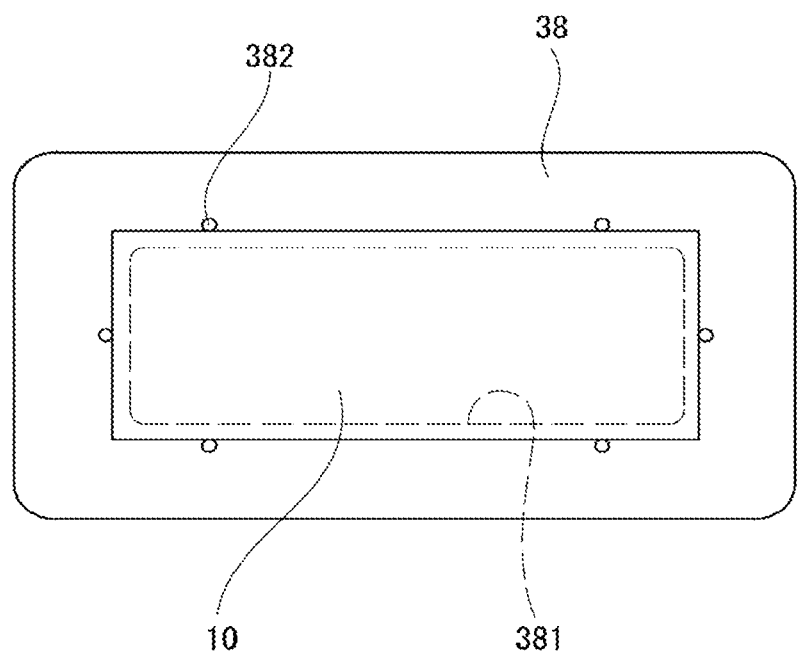
FIG. 6 is a plan view showing a board loaded on a pallet.

During printing, board 10 is inserted into opening section 371 of the attached template 37, and arranged such that the height of board 10 is aligned with the top surface of template 37 (refer to FIG. 4). In the present embodiment, the target is thin board 10 that warps when gripped from the sides by clamp sections 35. Therefore, board 10 is conveyed in the manufacturing line that includes screen printer 1 in a state held on pallet 38, which is a board conveyance member. Here, FIG. 6 is a plan view showing board 10 loaded on a pallet 38.

Pallet 38 is a frame member configured from a plate in which rectangular opening section 381 is formed in a central portion thereof. Opening section 381 matches the shape of board 10, and is formed with a size smaller than board 10. Multiple positioning protrusions 382 are provided around opening section 381 to match the external dimensions of board 10. Thus, board 10 is arranged on pallet 38 surrounded by multiple positioning protrusions 382, with external end sections loaded on outer edge portions of opening section 381.

Board conveyance 3 of screen printer 1 is provided with conveyor belts 11 on pair of side frames 33, and board 10 is configured to move on a lower side of clamp device 35, that is, below template 37. Further, in the present embodiment, board 10 is not conveyed directly by conveyor belts 11, but is conveyed in a state held by pallet 38.

Board support device 7 is provided below board conveyance device 3 and between the pair of side frames 33. Board support device 7 is configured with two backup blocks 42 for supporting board 10 from below fixed to backup table 41, and is moved in a vertical direction inside clamp device 5 by a raising and lowering means. Support body 31 of clamp device 5 is supported via a ball screw mechanism that converts rotation output of raising and lowering motor 43 into raising and lowering movement. Also, drive motor 44 is fixed to support body 31, and backup table 41 is supported via a ball screw mechanism that converts rotation output of raising and lowering motor 44 into raising and lowering movement.

Note that, board support device 7 of the present embodiment moves board 10 from pallet 38 to template 37 and arranges board 10 at a specified position. In other words, by the raised backup blocks 42 entering opening section 381 of pallet 38, board 10 loaded on the upper surface of backup block 42 is arranged inside opening section 371 of template 37. Multiple suction holes 421 are formed in backup block 42 on an upper surface that contacts board 10, and a vacuum device is connected to the multiple holes 421. Accordingly, board 10 is held by suction on the upper surface of backup block 42, and support during raising and lowering and printing is performed in that state.

Figure 3:
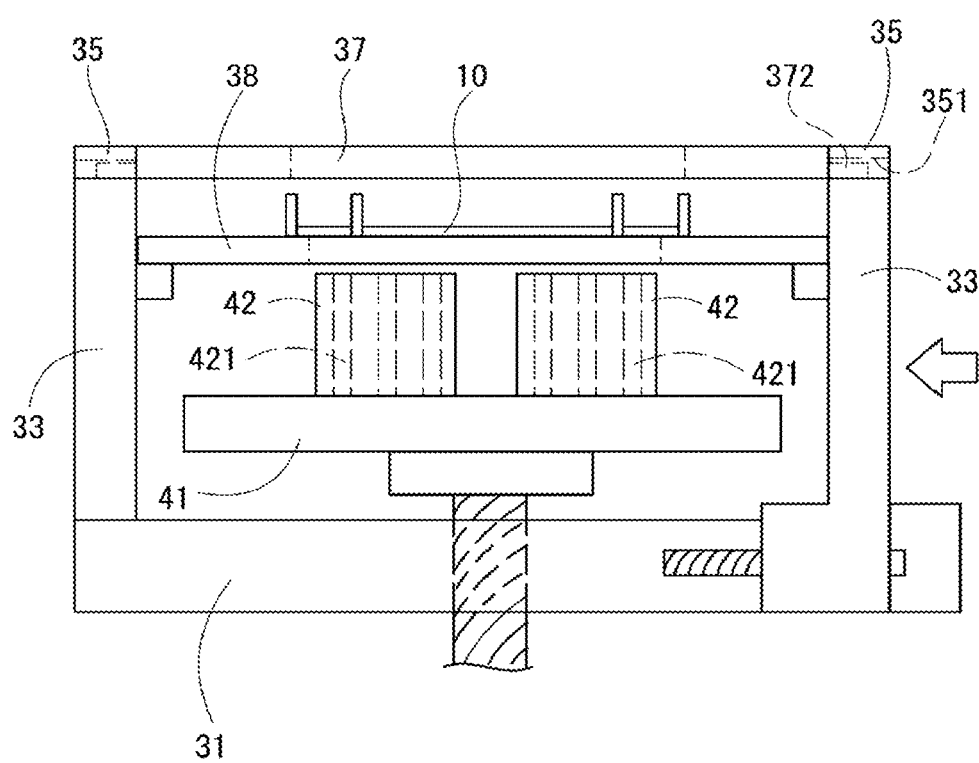
FIG. 3 is an enlarged view of a clamp device and surrounding items and shows a clamped state.

Next, effects of screen printer 1 are described. Here, similar to FIG. 2, FIGS. 3 and 4 are enlarged views of clamp device 5 and surrounding items, with FIGS. 2 to 4 representing changing states. With screen printer 1, board 10 loaded on pallet 38 is loaded by conveyor belts 11 and arranged under template 37 as shown in FIG. 2. Rotation is applied to screw shaft 36 such that, as shown in FIG. 3, one of the side frames 33 is moved in a direction that decreases the separation distance, and pallet 38 is sandwiched between the side frames 33. Further, template 37 goes from a state held only by attachment protrusions being inserted into attachment holes 351 to being sandwiched by the pair of clamp sections 35 for which the separation distance decreased.

Next, raising and lowering motor 44 is driven and, as shown in FIG. 4, raised backup blocks 42 pass through opening section 381 of pallet 38 such that board 10 is raised and moved into opening section 371 of template 37. Here, with the upper surface of backup blocks 42 at a height contacting the lower surface of board 10, vacuum holding is performed by the vacuum device via suction holes 421 such that board 10 is held by vacuum on the upper surface of backup blocks 42. Thus, raising and lowering of board 10 is performed in a stable state. Raised board 10 is inserted into opening section 371 of template 37 and positioned at a height aligned with the upper surface of template 37.

Then, raising and lowering motor 43 is driven such that clamp device 5 is raised in a state with template 37 and board 10 aligned at the same height, and the position is fixed with template 37 and the upper surface of board 10 substantially aligned at the height of stencil support plate 262. Further, by raising and lowering body 22 being raised by the driving of raising and lowering motor 23, board 10, template 37, and stencil support plate 262 are moved together, then stopped and positioned at the printing position directly under stencil 9. Next, solder paste is supplied onto the upper surface of stencil 9 and pressed into the printing pattern by squeegee device 4. Thus, solder paste is printed onto the board 10 positioned under stencil 9 via the through-holes of the printing pattern.

After printing, raising and lowering motor 44 is driven in reverse such that backup blocks 42 are separated from stencil 9. Similarly, raising and lowering motors 23 and 44 are driven in reverse such that clamp device 5, board supporting device 7, and the like are lowered and returned to their reference positions. Here, backup blocks 42 are lowered and the upper ends thereof pass through opening section 381 of pallet 38, but because the vacuum holding is stopped as the lowering is performed, the board 10 on which printing was performed is switched back to the pallet 38. Then, the distance separating the pair of side frames 33 is increased and the pallet 38, with board 10 loaded, is conveyed to the next work machine on conveyor belts 11.

Thus, according to screen printer 1 of the present embodiment, because board 10 is removed and arranged at the printing position under stencil 9, it is possible to use pallet 38 provided with multiple positioning protrusions 382 for conveyance of board 10, and exchanging of pallets between work machines is not required. Also, because board 10 during printing is surrounded by template 37 that is at the same height as board 10, printing pressure from a squeegee moving at a position separated from board 10 can be received by template 37 such that stable printing processing is achieved.

Further, template 37 is removable and configured simply such that attachment protrusions 372 are simply inserted into attachment holes 351 of clamp section 35. Therefore, attachment work for an operator can also be performed easily without using tools. Then, by removing template 37, a board that does not require a pallet can be clamped directly by pair of clamp sections 35. Also, because suction holes 421 are formed in backup blocks 42, and board 10 is held by suction via vacuum, board 10 is held stably during printing at the printing position arranged inside opening section 371 of template 37 without being clamped.

Note that, clamp device 5 is configured with clamp sections 35 configured such that the clamp rails that directly grip the board can be removed. Accordingly, with clamp device 5, in addition to template 37, it is possible to use a standard item or an item provided with attachment holes 351 in the clamp rails. Also, for board supporting device 7, exchangeable standard backup blocks and backup blocks 42 may be prepared. Thus, screen printer 1 of the present embodiment achieves the above effects without the need for large design changes from a conventional design. Note that, backup block 42 may be configured from multiple backup pins provided with suction holes. Also, for the vacuum device for holding board 10 via suction, because in a conventional screen printer a mechanism is provided for holding a stencil by suction, the same vacuum device can be used.

Figure 7:
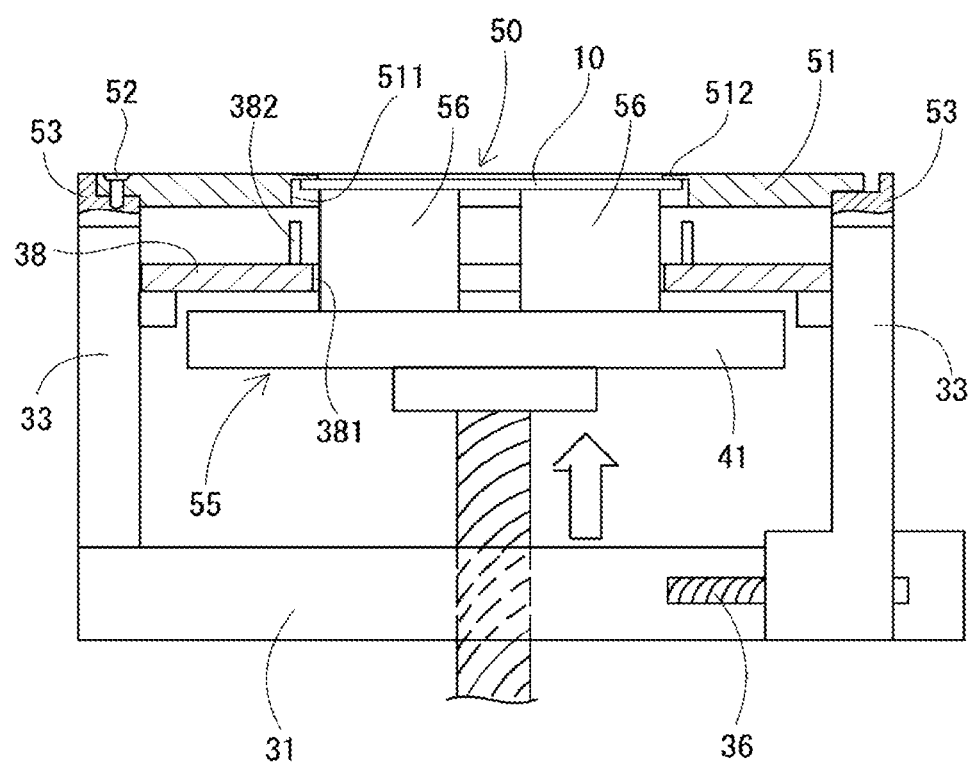
FIG. 7 shows an alternative clamp device.

Continuing, an alternative embodiment with a changed portion of screen printer 1 is described. FIG. 7 is an enlarged view of an alternative clamp device and board supporting device, with the same reference numerals being used for items that are the same as the above embodiment. The operation states of each device in FIG. 7 correspond to those in FIG. 4. First, clamp device 50 is provided with pair of side frames 33 and template 51 is removably attached to clamp section 53 on an upper end of side frames 33. In particular, template 51 of the present embodiment is fixed to clamp section 53 by bolt 52 at one end of template 51 in the widthwise direction, with the other end of template 51 being arranged on clamp section 53 in a free state.

Also, similar to the above embodiment, template 51 is a frame member configured from a plate in which rectangular opening section 511 is formed in a central portion thereof, and lip section 512 is formed around opening section 511. Lip section 512 protrudes to an inside at a top side of a circumferential side surface that configures opening portion 511 of template 51. A circumferential edge of raised board 10 contacts lip section 512 from below, and by the board 10 being supported from below by board supporting device 55, board 10 is positioned by being pressed in a vertical direction. This is because board supporting device 55 of the present embodiment does not have a configuration for holding board 10 by suction.

Thus, with this embodiment, backup blocks 56 that are raised pass through opening 381 of pallet 38 such that board 10 is raised and moved into opening section 511 of template 51. Here, a circumferential edge of board 10 contacts lip section 512 and is positioned inside opening section 511 of template 51 by being pressed in a vertical direction. Next, by the driving of raising and lowering device 8, the raised template 51 and board 10 are arranged at the printing position directly below stencil 9, and printing is performed onto the board 10 through stencil 9 that is above. Note that, it is desirable that during printing the height of the top surface of board 10 and template 51 are aligned, but because lip section 512 is extremely thin, the height of the top surface of board 10 and template 51 are aligned sufficiently to meet the demands for printing.

The above describes an embodiment of the present disclosure, but embodiments are not limited to these and various changes may be employed without departing from the scope of the disclosure. For example, backup blocks were given as an example in the second embodiment too, but multiple backup pins may be used. Also, in the present embodiment, descriptions are given with a backup block assuming that printing is performed on a primary surface, but when printing on the secondary surface of a board, because there are electronic components mounted on the bottom side of the board, cavities aligned with the positions of the electronic components may be provided in the top surface of the backup block, or a rubber plate in which through-holes are formed for holding the board by suction may be used.

REFERENCE SIGNS LIST

1: screen printer;
3: board conveyance device;
4: squeegee device;
5: clamp device;
7: board supporting device;
8: raising and lowering device;
9: stencil;
10: board;
11: conveyor belt;
35: clamp section;
37: template;
38: pallet;
42: backup block

The invention claimed is:

1. A screen printer comprising:
a squeegee device configured to spread from above solder paste on a stencil in which is formed a printing pattern;
a clamp device configured to grip a board conveyed to a position below the stencil by a board conveyance member that is flat and provided with a board holding portion in a central opening portion, the clamp device gripping the board via the board conveyance member, the board conveyance member including multiple positioning protrusions extending upward and provided around the central opening portion at positions based on external dimensions of the board;
a board supporting device configured to support the board from below and move the board in a vertical direction inside the clamp device; and
a raising and lowering device configured to move the board supported inside the clamp device in the vertical direction and position the board at a printing position,
wherein the clamp device is provided with a board printing guide member configured to be removably attached to an upper end of a pair of clamp members configured to sandwich the board conveyance member in a widthwise direction, the board printing guide member being formed with an opening portion in a central position thereof and configured such that the board raised from the board conveyance member by the board supporting device and arranged inside the opening portion is aligned with a top surface of the board printing guide member.

2. The screen printer according to claim 1, wherein
the board printing guide member is a flat member formed with an opening portion in a central portion thereof that matches a size of the board, and includes multiple attachment protrusions on both side surfaces in a widthwise direction, and
the board printing guide member is attached such that the attachment protrusions are inserted into attachment holes formed in an upper end of the clamp member.

3. The screen printer according to claim 1, wherein
the board printing guide member includes a lip section that protrudes to an inside at a top side of a circumferential side surface that configures the opening portion, such that an edge portion of the board raised by the board supporting device contacts the lip section.

4. The screen printer according to claim 1, wherein
the board supporting device includes a backup member configured to support the board from below, a suction hole being formed in an upper surface of the backup member, and the board being held via suction being performed through the suction hole.

* * * * *